(12) United States Patent
Cho et al.

(10) Patent No.: US 7,875,340 B2
(45) Date of Patent: Jan. 25, 2011

(54) HEAT RADIATION SUBSTRATE HAVING METAL CORE AND METHOD OF MANUFACTURING THE SAME

(75) Inventors: Seung Hyun Cho, Seoul (KR); Byoung Youl Min, Gyunggi-do (KR); Soon Jin Cho, Gyunggi-do (KR); Jin Won Choi, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 352 days.

(21) Appl. No.: 12/003,490

(22) Filed: Dec. 26, 2007

(65) Prior Publication Data

US 2009/0297801 A1 Dec. 3, 2009

(30) Foreign Application Priority Data

Jun. 18, 2007 (KR) ...................... 10-2007-0059556

(51) Int. Cl.
*H05K 1/00* (2006.01)

(52) U.S. Cl. ...................... 428/209; 174/256; 174/258; 174/262; 174/264; 361/750; 361/751

(58) Field of Classification Search .................. 428/209; 174/261–264, 256, 258; 361/750, 751
See application file for complete search history.

(56) References Cited

U.S. PATENT DOCUMENTS 4,221,925 A * 9/1980 Finley et al. ................. 174/266
4,495,378 A * 1/1985 Dotzer et al. ................ 174/252
4,769,270 A * 9/1988 Nagamatsu et al. .......... 428/131
6,323,439 B1 * 11/2001 Kambe et al. ................ 174/262
6,373,000 B2 * 4/2002 Nakamura et al. ........... 174/264
6,869,664 B2 * 3/2005 Vasoya et al. ................ 428/209
7,663,226 B2 * 2/2010 Cho et al. .................... 257/701

FOREIGN PATENT DOCUMENTS

| JP | 05-200877 | 8/1993 |
| JP | 2004-031765 | 1/2004 |
| KR | 10-2004-0027326 A | 4/2004 |
| KR | 1020050092225 A * | 9/2005 |

OTHER PUBLICATIONS

Korean Office Action dated Apr. 29, 2009 and issued in corresponding Korean Patent Application 10-2007-0059556.
Korean Office Action issued on Sep. 29, 2008 in corresponding Korean Patent Application.

* cited by examiner

*Primary Examiner*—Cathy Lam

(57) ABSTRACT

Disclosed herein is a method of manufacturing a heat radiation substrate, including injection-molding mixed powder of carbon nanotubes and metal in a die to fabricate a metal core having through holes; molding the entire metal core including the through holes with an insulating resin to fabricate a metal core substrate; processing the insulating resin provided in the through holes to form connection holes; and forming a circuit pattern on the metal core substrate in which the connection holes are formed.

5 Claims, 7 Drawing Sheets

Arm-chair structure

Zigzag structure

Bump Joint    Solder Joint

Thermal Via

HEAT RADIATION SUBSTRATE HAVING METAL CORE AND METHOD OF MANUFACTURING THE SAME

CROSS REFERENCE TO RELATED APPLICATION

This application claims the benefit of Korean Patent Application No. 10-2007-0059556, filed Jun. 18, 2007, entitled "Radiant Heat Substrate having Metal Core and Method for Manufacturing the Same", which is hereby incorporated by reference in its entirety into this application.

BACKGROUND OF THE INVENTION

1. Field of the Invention

The present invention relates to a heat radiation substrate and a method of manufacturing the same, and more particularly, to a method of efficiently manufacturing a heat radiation substrate having improved heat radiation characteristics and warpage characteristics by fabricating a high-strength metal core having through-holes preformed therein without additionally performing a hole formation process using a metal injection molding (MIM) process and then applying the metal core to a metal core substrate, and to a heat radiation substrate manufactured using the method.

2. Description of the Related Art

In a set of a mobile phone, a server, a network etc., which is speeding up, consumes high power, is highly integrated, and is decreased in size, the efficient heat-radiation of the set is a very important factor that serves to improve the reliability of the product and to prevent the malfunctions thereof. The principal cause of errors of the set, such as malfunctions, stoppage, and the like, is a chip having a high exothermic temperature.

In order to decrease the temperature of the chip, technologies of forcibly discharging a high heat generated from a chip by providing a radiation fin on the chip and driving a cooling fan have been used to date.

The radiation of a package is largely conducted through an air-cooling method using a radiation fin and a cooling fan and a water cooling method using a refrigerant or water. However, these air cooling and water cooling methods are problematic in that large-sized cooling apparatuses are required, and vibration and noise are generated.

In particular, as products are highly functionalized, the size of a cooling fan must be increased in order to improve the radiation performance thereof. Therefore, additional radiation measures are required because the cooling fan has a limited inner space and has a noise problem due to the high speed thereof.

Recently, novel cooling systems which can overcome vibration and noise have been developed. However, there is a problem in that they are expensive. Therefore, package industries are increasingly interested in the solution of heat radiation problems using a substrate. Since a substrate, which has a multi-layered structure, is composed of polymer resin having a very low thermal conductivity of 0.01 W/mK or less, the flow of heat generated in a chip is very poor.

In a general package, as the substrate structure shown in FIG. 6A, the path through which heat is rapidly transferred from a chip to a substrate is a path in which bump joints are connected to solder joints connected with a main board through a circuit layer made of Cu. However, the heat flowing through the path encounters great resistance due to an insulation layer having low thermal conductivity. Therefore, in order to enhance the heat radiation characteristics of a substrate, as a thermal via formed substrate and a metal core inserted substrate shown in FIGS. 6B and 6C, products that can decrease the temperature of a chip using a thermal via for radiation, which is made of Cu, formed at a portion of the substrate that is coupled with a chip, or a metal core inserted into the substrate, have come into the market.

These substrates with enhanced heat radiation characteristics have better heat radiation characteristics than those of the substrate shown in FIG. 6A, but have limitations in solving the radiation problem of a package that meets a high specification.

Hereinafter, a conventional method of manufacturing a heat radiation substrate having a metal core will be described with reference to FIG. 7A to 7H.

First, a dry film 12 is applied on both surfaces of a metal core 11, such as aluminum, holes 13 having a diameter of about 0.5 mm are formed in the metal core 11 through general exposure, developing and etching processes, and then the dry film is removed from the metal core 11 (see FIG. 7A to 7D).

Subsequently, an insulating resin 14, such as a prepreg, is applied on the both surfaces of the metal core 11 and in the holes 13, and then through-holes 15, having a diameter of about 0.25~0.3 mm, are formed through a CNC drilling process (see FIGS. 7E and 7F).

Subsequently, a copper seed layer 16 is formed through an electroless copper plating process, and then a circuit pattern 17 for a core including a via 18 is formed through a circuit forming process including an electrolytic plating process and a plugging process (see FIGS. 7G and 7H).

However, in the conventional method of manufacturing a heat radiation substrate having a metal core, there is a problem in that the sizes of the holes are not uniform due to the excess etching of the metal core at the time of forming holes through an etching process. Further, when a high-strength material, such as a carbon nanotube, is used as a material of the metal core, there is a problem in that it is difficult to form holes, and thus the material of the metal core is limited.

SUMMARY OF THE INVENTION

Accordingly, in order to solve the above problems occurring in the prior art, research has been continuously conducted. As a result, a heat radiation substrate that can enhance heat radiation characteristics using mixed powder of carbon nanotubes and metal such that heat generated from a chip is discharged to a substrate has been proposed.

In an aspect, the present invention provides a heat radiation substrate having a high-strength metal core having a high heat radiation rate and a method of manufacturing the same.

In another aspect, the present invention provides a heat radiation substrate manufactured such that it is highly reliable through a simple process without performing a hole forming process, and a method of manufacturing the same.

A method of manufacturing a heat radiation substrate according to an embodiment of the present invention includes injection-molding mixed powder of carbon nanotubes and metal in a die to fabricate a metal core having through holes; molding all of the metal core including the through holes with an insulating resin to fabricate a metal core substrate; processing the insulating resin provided in the through holes to form connection holes; and forming a circuit pattern on the metal core substrate in which the connection holes are formed.

In the method, the metal may be selected from the group consisting of aluminum (Al), copper (Cu), iron (Fe), nickel (Ni), alloys thereof, and stainless steel.

The amount of carbon nanotubes in the mixed powder may be 20% by weight or less.

The insulating resin may be selected from the group consisting of a thermosetting resin, a thermoplastic resin, a filler-containing thermosetting resin, a filler-containing thermoplastic resin, and combinations thereof.

The method may further include forming at least one outer circuit layer using a build-up process.

A heat radiation substrate according to another embodiment of the present invention includes a metal core having through holes fabricated by injection-molding mixed powder of carbon nanotubes and metal in a die; an insulation layer molded in all of the metal core including the through-holes; connection holes formed by processing the insulating resin provided in the through holes; and a circuit pattern formed on the insulation layer in which the connection holes are formed.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1A:
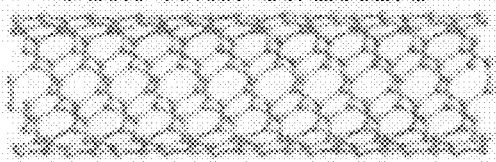
FIGS. 1A to 1C are views showing structures of carbon nanotubes, respectively.
Figure 1A:
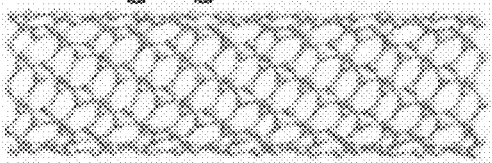

Hereinafter, preferred embodiments of the present invention will be described in detail with reference to the attached drawings.

Reference now should be made to the drawings, in which the same reference numerals are used throughout the different drawings to designate the same or similar components.

As described above, in the present invention, a metal core, in which carbon nanotubes are combined with the existing high thermal conductivity metallic materials, is inserted into a substrate.

Figure 1B:
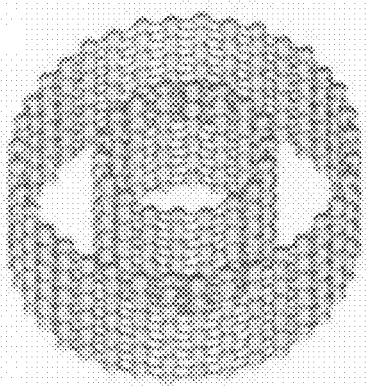
Figure 1C:
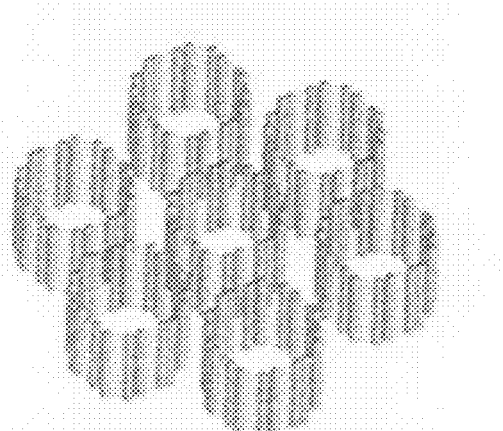

As shown in FIGS. 1A to 1C, carbon nanotubes, which are materials having carbon chains, such as a single-walled nanotube structure (see FIG. 1A), a multi-walled nanotube structure (see FIG. 1B), and a nanotube rope structure, have a thermal conductivity of about 3000~6000 W/mK. Carbon nanotubes have very high radiation performance, considering that the thermal conductivities of copper and aluminum, which are used as materials having excellent thermal conductivity, are 350 W/mK and 210 W/mK, respectively. In particular, carbon nanotubes are very useful in the dissipation of heat from a small area such as in a chip because the chain structure thereof determines the direction of heat transfer therethrough.

However, when carbon nanotubes are used by combining them with other metal cores, the carbon nanotubes are problematic in that it is difficult to uniformly mix them with other metallic materials having high thermal conductivity, and a bit of a drill is badly worn and breaks at the time of forming holes through a general drilling process because they have very high strength. In order to overcome the above problem, the present invention provides a method of fabricating a metal core using a metal injection molding (MIM) method.

Hereinafter, a method of fabricating a metal core using a metal injection molding (MIM) method according to an embodiment of the present invention will be described with reference to FIGS. 2A to 2E.

Figure 2A:
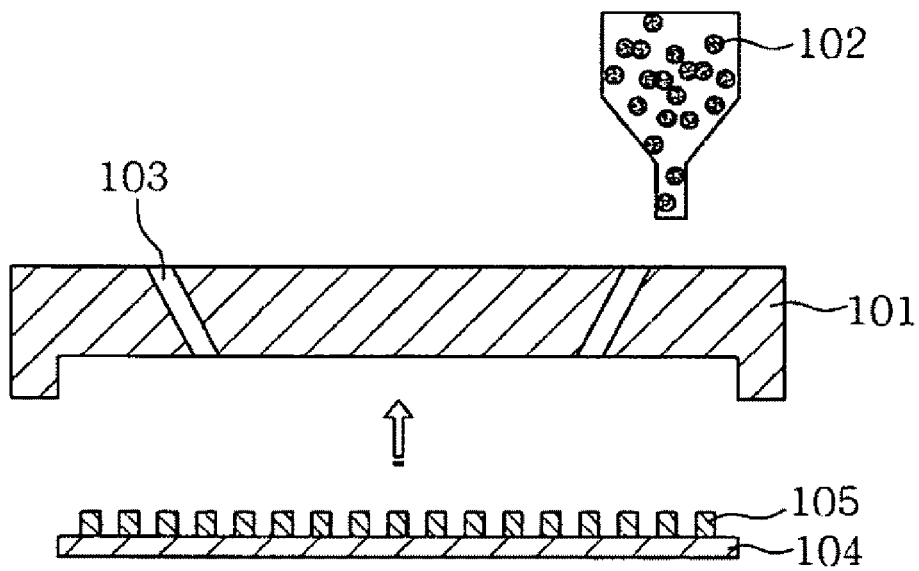
FIGS. 2A to 2E are schematic views showing a process of fabricating a metal core through a metal injection molding (MIM) method according to an embodiment of the present invention.
Figure 2B:
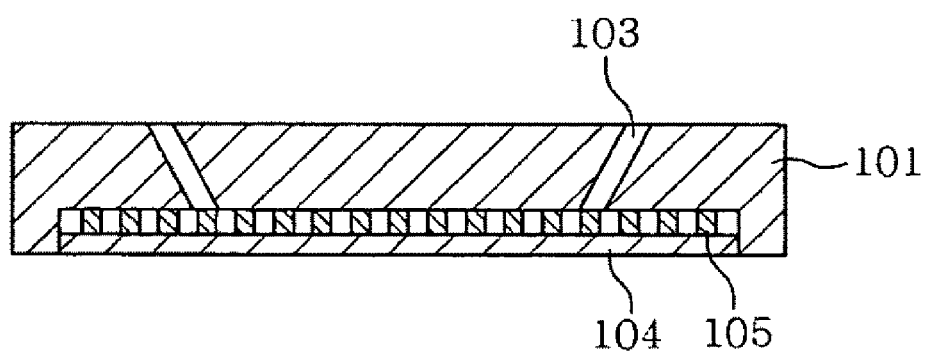
Figure 2C:
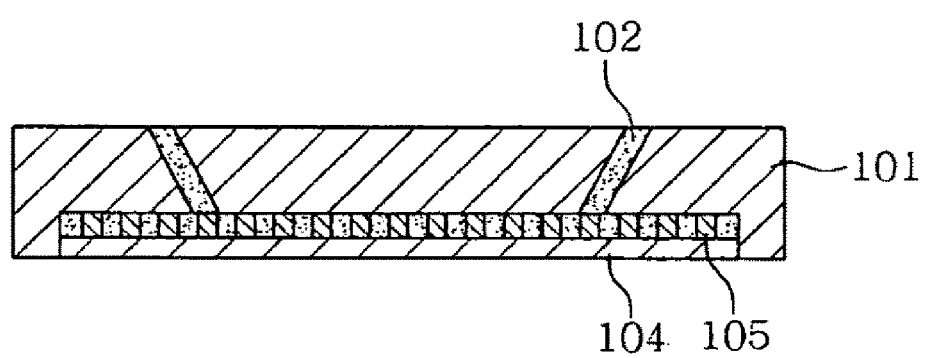
Figure 2D:
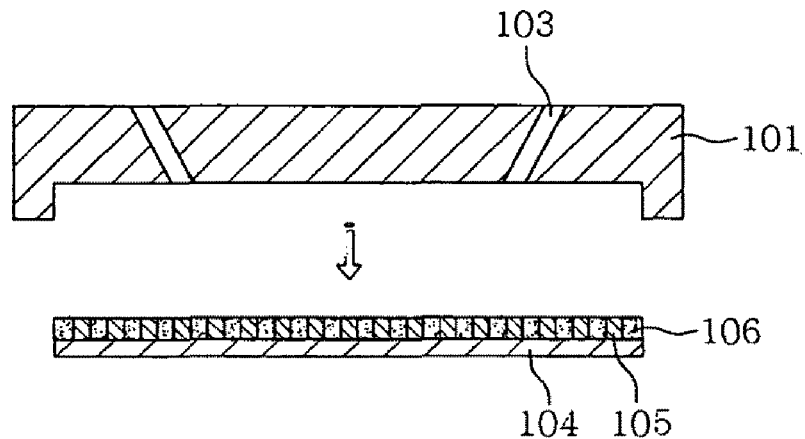

First, a die set having an upper die 101 and a lower die 104 is provided (see FIG. 2A). Specifically, the upper die 101 is provided with a raw material inlet 103 for introducing mixed powder, in which carbon nanotubes are mixed with metal having high thermal conductivity, thereinto, and the lower die 104 is provided with hole pins 105 that are the same size as holes.

In this case, if necessary, one or more of the raw material inlets 103 may be provided in the upper die 101. Meanwhile, since the lower die 104 is provided with hole pins 105 that are the same size as holes, a metal core, in which through-holes having a size corresponding to that of holes are preformed, can be fabricated without performing an additional hole forming process for interlayer conduction, such as drilling, etc.

Figure 2E:
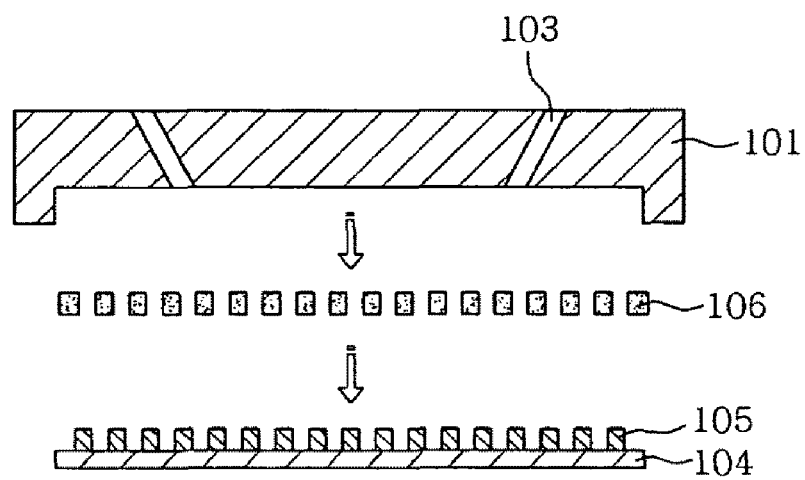
Figure 3:
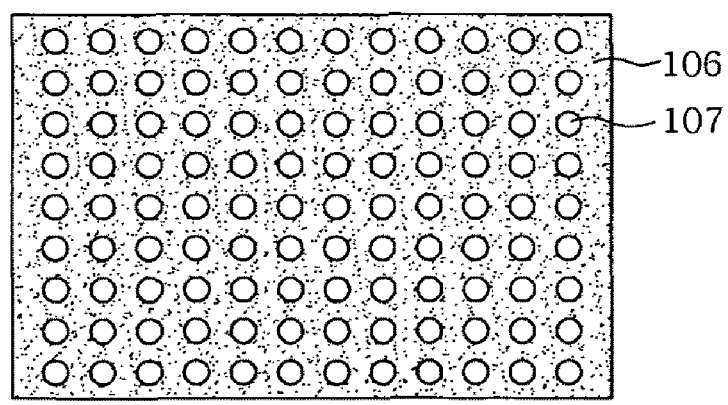
FIG. 3 is a schematic plan view showing a metal core fabricated through a metal injection molding (MIM) method according to an embodiment of the present invention.

Subsequently, after the upper die 101 is coupled with the lower die 104 (see FIG. 2B), mixed powder 102, in which carbon nanotubes are mixed with metal having high thermal conductivity, is introduced between the upper die 101 and the lower die 104 (see FIG. 2C), the mixed powder is injection-molded at a predetermined temperature and pressure to form a metal core 106, the upper die 101 is opened (FIG. 2D), and then the metal core 106 is separated from the lower die 104 (FIG. 2E). FIG. 3 shows the shape of the metal core having through holes 107, fabricated in this way.

Examples of the metal having high thermal conductivity may include, but are not limited to, any one selected from among aluminum (Al), copper (Cu), iron (Fe), nickel (Ni), alloys thereof, and stainless steel, and combinations of two or more thereof. Any metal can be used as long as it is commonly used as a metallic material of a heat radiation substrate in the art. Examples of commercially available metallic materials may include, but are not limited to, Invar etc.

The amount of carbon nanotubes in the mixed powder may be appropriately selected depending on the practical applications of the metal core, and may be about 20% by weight or less.

If necessary, the mixed powder may include a binder etc. in addition to the carbon nanotubes and metal having high thermal conductivity.

Hereinafter, a method of manufacturing a heat radiation substrate using the metal core will be described with reference to FIGS. 4A to 4E.

Figure 4A:
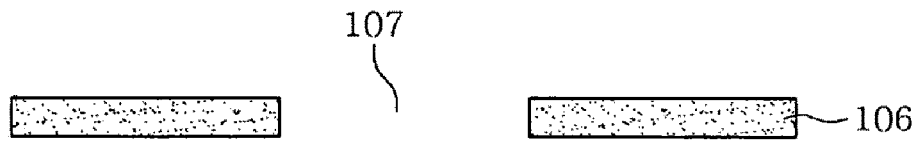
FIGS. 4A to 4E are schematic views showing a process of manufacturing a heat radiation substrate including the metal core according to an embodiment of the present invention.
Figure 4B:
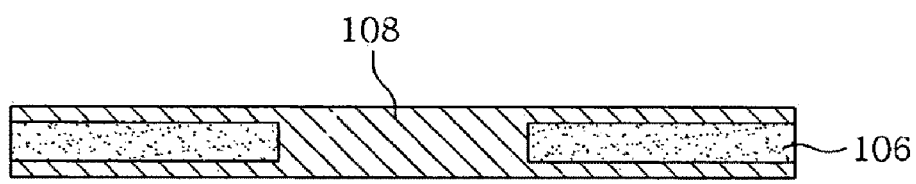

First, a metal core 106 having through holes 107, the metal core 106 being fabricated using the method described with reference to FIGS. 2B to 2E, is provided, and then the entire metal core 106 including the through holes 107 is molded with an insulating resin 108, thus fabricating a metal core substrate (see FIGS. 4A and 4B).

When molding the entire metal core including the through holes, the entire metal core 106 including the through holes may be coated with an insulating resin, or an insulating resin layer may be placed on both surfaces of the metal core, but the invention is not limited thereto.

Any insulating resin can be used as the insulating resin as long as it is commonly used in the art. However, the insulating resin may be selected from the group consisting of a thermosetting resin, a thermoplastic resin, a base filler-containing thermosetting resin, a filler-containing thermoplastic resin, and combinations thereof.

Figure 4C:
Figure 4D:

Subsequently, connection holes 109 are formed by processing the insulating resin 108 provided in the through holes 107 (see FIG. 4C).

Figure 4E:
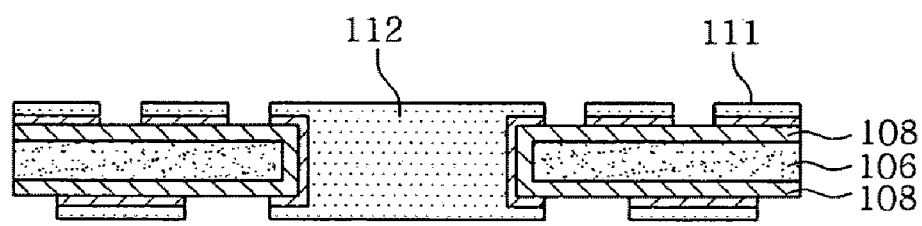

Then, using a general circuit layer forming method, a metal seed layer 110 is formed on the metal core substrate, in which connection holes 109 are formed, through an electroless metal plating process (see FIG. 4D), a patterned plated layer is formed on the seed layer 110 through an electrolytic metal plating process, and then the seed layer is flash-etched, thus forming a circuit pattern 111 including vias 112 (see FIG. 4E). In this case, the connection holes 109 may be filled with an electrolytic metal plated layer or conductive paste without limitation, using methods well known in the art.

Figure 5:
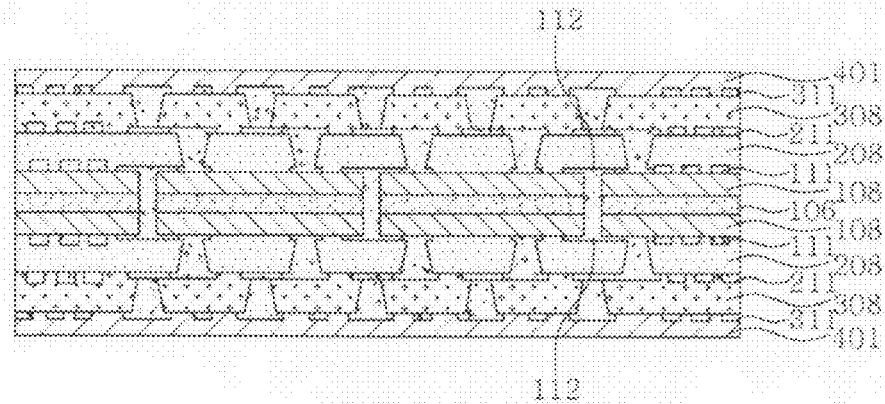
FIG. 5 is a schematic sectional view showing a multi-layered heat radiation substrate including the metal core according to an embodiment of the present invention.
Figure 6A:
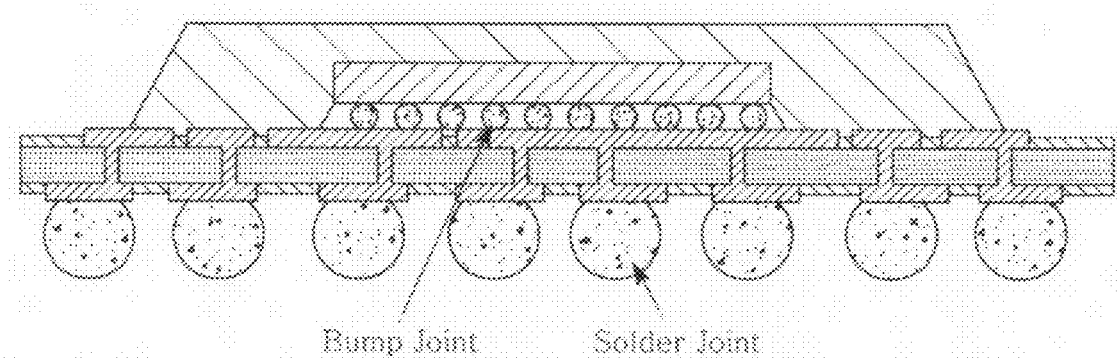
FIGS. 6A to 6B are views explaining a general radiation method of a substrate.
Figure 6B:
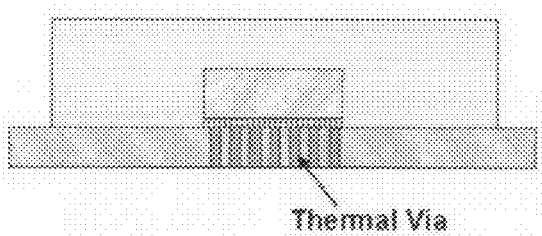
Figure 7A:
FIGS. 7A to 7H are schematic views showing a conventional process of manufacturing a heat radiation substrate having a metal core.
Figure 7B:
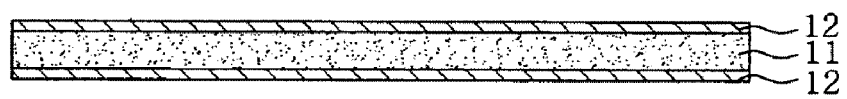
Figure 7C:
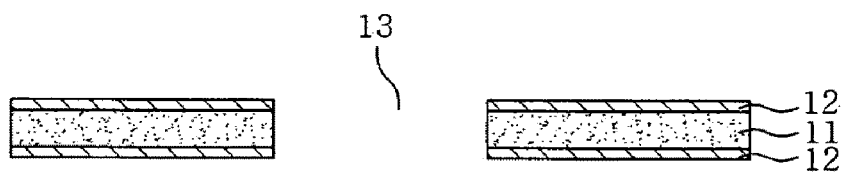
Figure 7D:
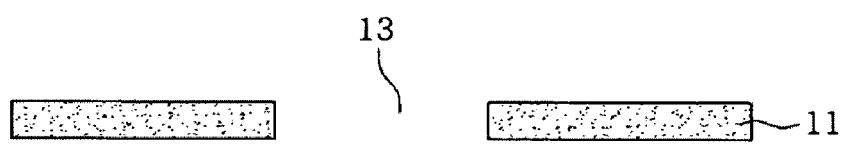
Figure 7E:
Figure 7F:
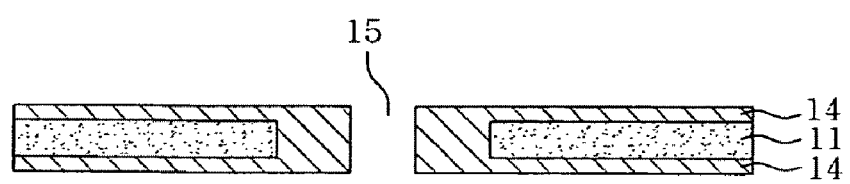
Figure 7G:
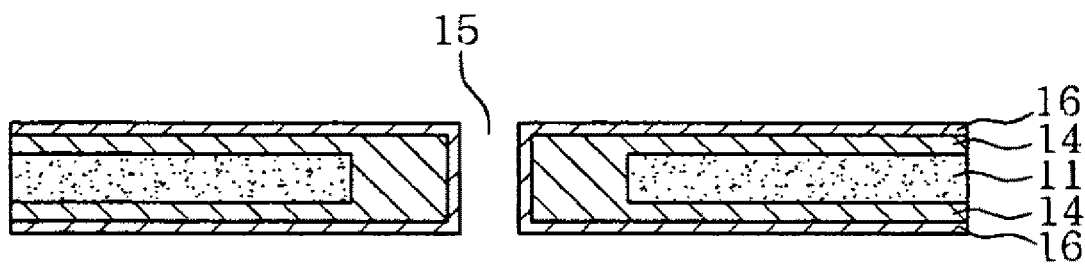
Figure 7H:
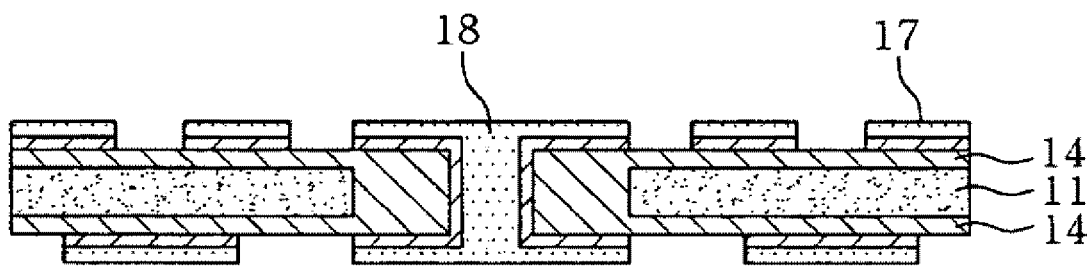

According to the present invention, insulating resin layers 208 and 308 are layered on the substrate, on which the circuit layer is formed, through a general build-up process, and circuit patterns 211 and 311 are formed on the respective insulating resin layers 208 and 308 through a circuit forming process, thus further forming at least one outer circuit layer. Moreover, a solder resist layer 401 may be formed on the outermost circuit layer (see FIG. 5), and then the solder resist layer 401 may be surface-treated using a commonly used solder resist opening process and a nickel/gold plating process.

In this way, when carbon nanotubes are used to manufacture a heat radiation substrate, since the area of the heat radiation substrate is larger than that of a chip, which is a heating element, the temperature of the chip is greatly decreased, so that, in a package system, the size and capacity of a cooling system including a cooling fan and a radiation fin are decreased, or the cooling system is not required, thereby decreasing the manufacturing cost of the heat radiation substrate.

Further, since the metal core fabricated using carbon nanotubes has far higher thermal conductivity than that of Al, Cu, or the like, the heat transferred from a chip to the metal core can be rapidly diffused, thus greatly improving heat radiation characteristics.

Although many ideas, based on the insertion of a metal core into a substrate, have been proposed to overcome the problem that a substrate undergoes greater warpage as it is thinner, they suffer from the disadvantage of requiring a hole forming process. However, in the present invention, since the hole forming process is not performed, when a metal core is inserted into a substrate, the warpage of the substrate can be decreased and the substrate can be thin. In particular, since carbon nanotubes have very high strength (elastic modulus>1,000 GPa), the warpage of the substrate can be greatly decreased.

Moreover, since the heat radiation substrate is manufactured using a metal core fabricated through an MIM process, the following advantages can be realized.

First, it is very important to uniformly combine carbon nanotubes with metallic materials in order to improve heat radiation characteristics. Therefore, in the present invention, since mixed powder, in which carbon nanotubes are mixed with metallic materials, is introduced and injection-molded through an MIM process, the carbon nanotubes are easily combined with the metallic materials.

Second, in the present invention, since the heat radiation substrate is manufactured using a metal core in which holes are pre-formed, a hole forming process need not be performed, and thus the cost of manufacturing the substrate can be greatly reduced.

As described above, according to the present invention, since the heat radiation substrate is manufactured using a metal core fabricated using mixed powder of carbon nanotubes and metal through an MIM process, the carbon nanotubes are uniformly combined with metal, thus realizing a heat radiation substrate having uniform heat radiation characteristics.

Further, according to the present invention, a heat radiation substrate having a metal core can be manufactured without performing a hole forming process, through an MIM process. When the metal core is modified into various forms, other than a plate form, or a radiating material, such as carbon nanotubes, is additionally introduced, it is impossible to manufacture the heat radiation substrate using conventional methods, such as soldering, brazing and the like, but it is possible to manufacture a heat radiation substrate having a high-strength metal core having a desired shape without performing an additional hole forming process, through an MIM process.

As described above, although the preferred embodiments of the present invention have been disclosed for illustrative purposes, the heat radiation substrate and manufacturing method thereof according to the present invention are not limited thereto, and those skilled in the art will appreciate that various modifications, additions and substitutions are possible, without departing from the scope and spirit of the invention as disclosed in the accompanying claims.

What is claimed is:

1. A heat radiation substrate having a metal core, comprising:
   a metal core having through holes fabricated by injection-molding mixed powder of carbon nanotube powder and metal powder in a die;
   an insulation layer molded in the entire metal core including the through-holes;
   connection holes formed by processing the insulating resin provided in the through holes; and
   a circuit pattern formed on the insulation layer, in which the connection holes are formed.

2. The heat radiation substrate having a metal core according to claim 1, wherein the metal powder is selected from the group consisting of aluminum (Al), copper (Cu), iron (Fe), nickel (Ni), alloys thereof, and stainless steel.

3. The heat radiation substrate having a metal core according to claim 1, wherein an amount of the carbon nanotube powder in the mixed powder is 20% by weight or less.

4. The heat radiation substrate having a metal core according to claim 1, wherein the insulating resin is selected from the group consisting of a thermosetting resin, a thermoplastic resin, a filler-containing thermosetting resin, a filler-containing thermoplastic resin, and combinations thereof.

5. The heat radiation substrate having a metal core according to claim 1, further comprising at least one outer circuit layer layered using a build-up process.

* * * * *